(12) United States Patent
Soliman

(10) Patent No.: US 10,110,168 B2
(45) Date of Patent: Oct. 23, 2018

(54) MULTI-MODE STACKED AMPLIFIER

(71) Applicant: Skyworks Solutions, Inc., Woburn, MA (US)

(72) Inventor: Yasser Khairat Soliman, Kanata (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/474,905

(22) Filed: Mar. 30, 2017

(65) Prior Publication Data

US 2017/0288609 A1    Oct. 5, 2017

Related U.S. Application Data

(60) Provisional application No. 62/316,864, filed on Apr. 1, 2016.

(51) Int. Cl.
| | |
|---|---|
| H03F 1/22 | (2006.01) |
| H03F 1/02 | (2006.01) |
| H03F 3/195 | (2006.01) |
| H03F 3/213 | (2006.01) |
| H03F 1/56 | (2006.01) |

(52) U.S. Cl.
CPC ............. *H03F 1/0216* (2013.01); *H03F 1/56* (2013.01); *H03F 3/195* (2013.01); *H03F 3/213* (2013.01); *H03F 2200/222* (2013.01); *H03F 2200/294* (2013.01); *H03F 2200/312* (2013.01); *H03F 2200/336* (2013.01); *H03F 2200/387* (2013.01); *H03F 2200/411* (2013.01); *H03F 2200/451* (2013.01)

(58) Field of Classification Search
CPC ....................................................... H03F 1/22

USPC ........................................... 330/296, 285, 311
See application file for complete search history.

(56) References Cited

U.S. PATENT DOCUMENTS

| | | | |
|---|---|---|---|
| 4,079,336 A | 3/1978 | Gross | |
| 7,053,718 B2 | 5/2006 | Dupuis et al. | |
| 7,352,247 B2 * | 4/2008 | Oh ........................ | H03F 1/223 330/310 |
| 7,786,807 B1 | 8/2010 | Li et al. | |

(Continued)

FOREIGN PATENT DOCUMENTS

KR    10-2010-0059724    6/2010

OTHER PUBLICATIONS

PCT International Search Report dated Jun. 29, 2017 for International Application No. PCT/US2017/025091 filed Mar. 30, 2017, 3 pages.

(Continued)

*Primary Examiner* — Henry Choe
(74) *Attorney, Agent, or Firm* — Knobbe, Martens, Olson & Bear, LLP

(57) ABSTRACT

Aspects of this disclosure relate to an amplification circuit that includes a stacked amplifier and a bias circuit. The stacked amplifier includes at least a first transistor and a second transistor in series with each other. The stacked amplifier is operable in at least a first mode and a second mode. The bias circuit is configured to bias the second transistor to a linear region of operation in the first mode and to bias the second transistor as a switch in the second mode. In certain embodiments, the amplification circuit can be a power amplifier stage configured to receive a supply voltage that has a different voltage level in the first mode than in the second mode.

20 Claims, 12 Drawing Sheets

(56) References Cited

U.S. PATENT DOCUMENTS

| | | | |
|---|---|---|---|
| 7,952,433 B2 | 5/2011 | An et al. | |
| 8,131,251 B2 | 3/2012 | Burgener et al. | |
| 8,847,689 B2 * | 9/2014 | Zhao | H03F 1/0283 |
| | | | 330/277 |
| 9,000,847 B2 * | 4/2015 | Zhao | H03F 1/42 |
| | | | 330/302 |
| 9,019,010 B2 | 4/2015 | Costa | |
| 9,219,445 B2 | 12/2015 | Nobbe et al. | |
| 9,369,087 B2 | 6/2016 | Burgener et al. | |
| 9,680,416 B2 * | 6/2017 | Burgener | H01Q 23/00 |
| 2007/0075693 A1 | 4/2007 | Xi | |
| 2007/0273445 A1 * | 11/2007 | Sarkar | H03F 1/22 |
| | | | 330/278 |
| 2014/0256271 A1 | 9/2014 | Kok | |
| 2015/0155831 A1 * | 6/2015 | Shirvani | H03F 1/0211 |
| | | | 330/295 |
| 2015/0162877 A1 | 6/2015 | Ni | |
| 2015/0270806 A1 | 9/2015 | Wagh et al. | |
| 2015/0340992 A1 | 11/2015 | Korol et al. | |

OTHER PUBLICATIONS

PCT Written Opinion of the International Searching Authority dated Jun. 29, 2017 for International Application No. PCT/US2017/025091 filed Mar. 30, 2017, 7 pages.

* cited by examiner

MULTI-MODE STACKED AMPLIFIER

CROSS REFERENCE TO PRIORITY APPLICATION

This application claims the benefit of priority under 35 U.S.C. § 119(e) of U.S. Provisional Patent Application No. 62/316,864, filed Apr. 1, 2016 and titled "MULTI-MODE STACKED AMPLIFIER," the disclosure of which is hereby incorporated by reference in its entirety herein.

BACKGROUND

Technical Field

This disclosure relates to electronic systems and, in particular, to amplifiers.

Description of Related Technology

Radio frequency (RF) power amplifiers can be used to boost the power of an RF signal having a relatively low power. Thereafter, the boosted RF signal can be used for a variety of purposes, including, for example, driving an antenna, a switch, a mixer and/or a filter in an RF system.

Power amplifiers can be included in a wide variety of communications devices to amplify an RF signal for transmission. Example communications devices include, but are not limited to, mobile phones, tablets, base stations, network access points, laptops, computers, and televisions. As an example, in mobile phones that communicate using a cellular standard, a wireless local area network (WLAN) standard, and/or any other suitable communication standard, a power amplifier can be used to amplify the RF signal. An RF signal can have a frequency in the range from about 30 kHz to 300 GHz, such as in a range from about 450 MHz to about 6 GHz for certain communications standards.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an amplification circuit including a stacked amplifier and a bias circuit. The stacked amplifier includes at least a first transistor and a second transistor in series with each other. The stacked amplifier is operable in at least a first mode and a second mode. The bias circuit is configured to bias the second transistor to a linear region of operation in the first mode, and to bias the second transistor as a switch in the second mode.

The stacked amplifier can include a third transistor in series with the first and second transistors. The second transistor can be is arranged in series between the first transistor and the third transistor. The first transistor, the second transistor, and the third transistor can be silicon-on-insulator transistors. The second transistor can be a field effect transistor having a source electrically connected to the first transistor and a drain electrically connected to the third transistor. The second transistor can be arranged in series between ground and first transistor, and the second transistor can be arranged in series between ground and the third transistor.

The stacked amplifier can include four transistors in series with each other.

The stacked amplifier can be configured to amplify a radio frequency signal.

The bias circuit can be configured to bias the second transistor in a saturation region of operation in the second mode.

The amplification circuit can further include a first stage amplifier having an output electrically connected to an input of the stacked amplifier. The output can be electrically connected to the input of the stacked amplifier by way of a matching network.

The first transistor and the second transistor can be semiconductor-on-insulator transistors. The first transistor and the second transistor can be silicon-on-insulator transistors.

The stacked amplifier can be a power amplifier that includes at least three stacked silicon-on-insulator transistors. The first transistor can be a common gate transistor and the stacked amplifier can include a common source transistor configured to provide an output of the stacked amplifier. The stacked amplifier can be operable in a third mode, the bias circuit can be configured to bias the second transistor to the linear region of operation in the third mode, and the stacked amplifier can be configured to receive a supply voltage that has a different voltage level in the first mode than in the third mode.

The second transistor can be a field effect transistor and the bias circuit can be configured to bias the second transistor such that the second transistor has a drain-to-source voltage of less than 75 mV in the second mode. The second transistor can be a field effect transistor and the bias circuit can be configured to bias the second transistor such that the second transistor has a drain-to-source voltage of less than 100 mV in the second mode.

The stacked amplifier can be operable in a third mode, the bias circuit can be configured to bias the second transistor to the linear region of operation in the third mode, and the stacked amplifier can be configured to receive a supply voltage that has a different voltage level in the first mode than in the third mode.

The second mode can be associated with a lower power than the first mode.

The stacked amplifier can be configured to receive a supply voltage that has a lower voltage level in the second mode than in the first mode.

The amplification circuit can include an input switch configured to provide an input signal to the second transistor in the first mode and to provide the input signal to the first transistor in the second mode, in which the stacked amplifier is configured to amplify the input signal.

The amplification circuit can include an output matching network electrically connected to an output of the stacked amplifier. The output matching can be a class F output matching network. The output matching network can be a class AB output matching network. The amplification circuit can includes a multi-stage power amplifier having an input configured to receive a radio frequency signal by way of an input matching network and the stacked amplifier can be configured to provide the output of the multi-stage power amplifier.

The bias circuit can be configured to dynamically generate biases for the first transistor and for the second transistor based on a control signal.

Another aspect of this disclosure is a front end system that includes a low noise amplifier, a power amplifier, and a switch electrically connected to the low noise amplifier and the power amplifier circuit. The power amplifier circuit includes a stacked amplifier including at least a first transistor and a second transistor in series with each other. The stacked amplifier is operable in at least a first mode and a second mode. The power amplifier circuit further includes a bias circuit configured to bias the second transistor to a linear region of operation in the first mode and to bias the second transistor as a switch in the second mode.

The front end system can be a front end module. The front end system can be a front end integrated circuit.

The switch can be multi-throw switch having at least a first throw electrically coupled to the power amplifier circuit and a second throw electrically coupled to the low noise amplifier. The multi-throw switch can include a third throw. The front end system can include a bypass path electrically coupled to the third throw. The front end system can include a second multi-throw switch having at least a first throw electrically connected to the power amplifier circuit and a second throw electrically connected to the low noise amplifier. The multi-throw switch can be configured to electrically connect an output of the power amplifier circuit to an antenna in a first state, and the multi-throw switch can be configured to electrically connect the low noise amplifier to the antenna in a second state. The multi-throw switch can have at least two poles.

The low noise amplifier and the power amplifier circuit can be embodied on a single die. The die can be a semiconductor-on-insulator die.

The front end system can further include an antenna electrically coupled to the switch.

The power amplifier circuit, the low noise amplifier, and the switch can be embodied on a single die. The single die can be a silicon-on-insulator die.

The power amplifier circuit includes one or more suitable features of the amplification circuits discussed herein.

The front end system can include a package enclosing the power amplifier, circuit the low noise amplifier, and the switch.

Another aspect of this disclosure is power amplifier system including a power amplifier stage, a bias circuit, and a supply control circuit. The power amplifier stage includes at least a first transistor and a second transistor in series with each other. The power amplifier stage is operable in at least a first mode and a second mode. The bias circuit is configured to bias the second transistor to a linear region of operation in the first mode, and to bias the second transistor as a switch in the second mode. The supply control circuit is configured to provide a supply voltage to the power amplifier stage. The supply voltage has a higher voltage level in the first mode than in the second mode.

The bias circuit can be configured to receive a mode control signal and to bias the second transistor based on the mode control signal. The supply control circuit can be configured to receive the mode control signal and to adjust the voltage level of the supply voltage based on the mode control signal.

The supply control circuit can include a direct current to direct current voltage converter.

The power amplifier system can include a multi-throw switch in a signal path between the power amplifier stage and an antenna.

The power amplifier system can includes one of more suitable features of amplification circuits discussed herein.

Another aspect of this disclosure is a power amplifier die including a power amplifier stage and a bias circuit. The power amplifier stage includes at least a first transistor and a second transistor in series with each other. The power amplifier stage is operable in at least a first mode and a second mode. The bias circuit is configured to bias the second transistor to a linear region of operation in the first mode, and to bias the second transistor as a switch in the second mode.

The power amplifier die can include a supply control circuit configured to provide a supply voltage to the power amplifier stage, in which the supply voltage has a higher voltage level in the first mode than in the second mode.

The power amplifier die can include one of more suitable features of power amplifier systems and/or the amplification circuits discussed herein.

Another aspect of this disclosure is wireless communication device including a power amplifier circuit, a transmitter circuit, and an antenna. The power amplifier circuit includes a stacked amplifier including at least a first transistor and a second transistor in series with each other. The power amplifier circuit also includes a bias circuit configured to bias the second transistor to a linear region of operation in a first mode, and to bias the second transistor as a switch in a second mode. The transmitter circuit is configured to provide a radio frequency signal to the power amplifier circuit for amplification. The antenna is configured to transmit a signal received from the power amplifier circuit.

The antenna can receive the signal from the power amplifier circuit by way of a multi-throw switch.

A wireless personal area network system can includes the power amplifier circuit and the transmitter circuit, and the power amplifier circuit can be configured to amplify a wireless personal area network signal.

A wireless local area network system can include the power amplifier circuit and the transmitter circuit, and the power amplifier circuit can be configured to amplify a wireless local area network signal.

The transmitter circuit can be embodied in a transceiver.

The wireless communication device can include a power management circuit configured to provide a mode control signal to the power amplifier circuit.

The wireless communication device can include a second antenna associated with a different radio frequency front end than the antenna.

The wireless communication device can include a front end system including the power amplifier circuit and the transmitter circuit. The front end system can also include a low noise amplifier and a switch that is electrically coupled to both the low noise amplifier and the power amplifier circuit.

The wireless communication device can include one or more suitable features of front end systems discussed herein.

The wireless communication device can include a supply control circuit configured to provide a supply voltage to the power amplifier circuit, in which the supply voltage has a higher voltage level in the first mode than in the second mode. The bias circuit can be configured to receive a mode control signal and to bias the second transistor based on the mode control signal. The supply control circuit can be configured to receive the mode control signal and to adjust the voltage level of the supply voltage based on the mode control signal. The wireless communication device can include a multi-throw switch in a signal path between the power amplifier stage and an antenna.

The wireless communication device can include one or more suitable features of the power amplifier circuits discussed herein.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
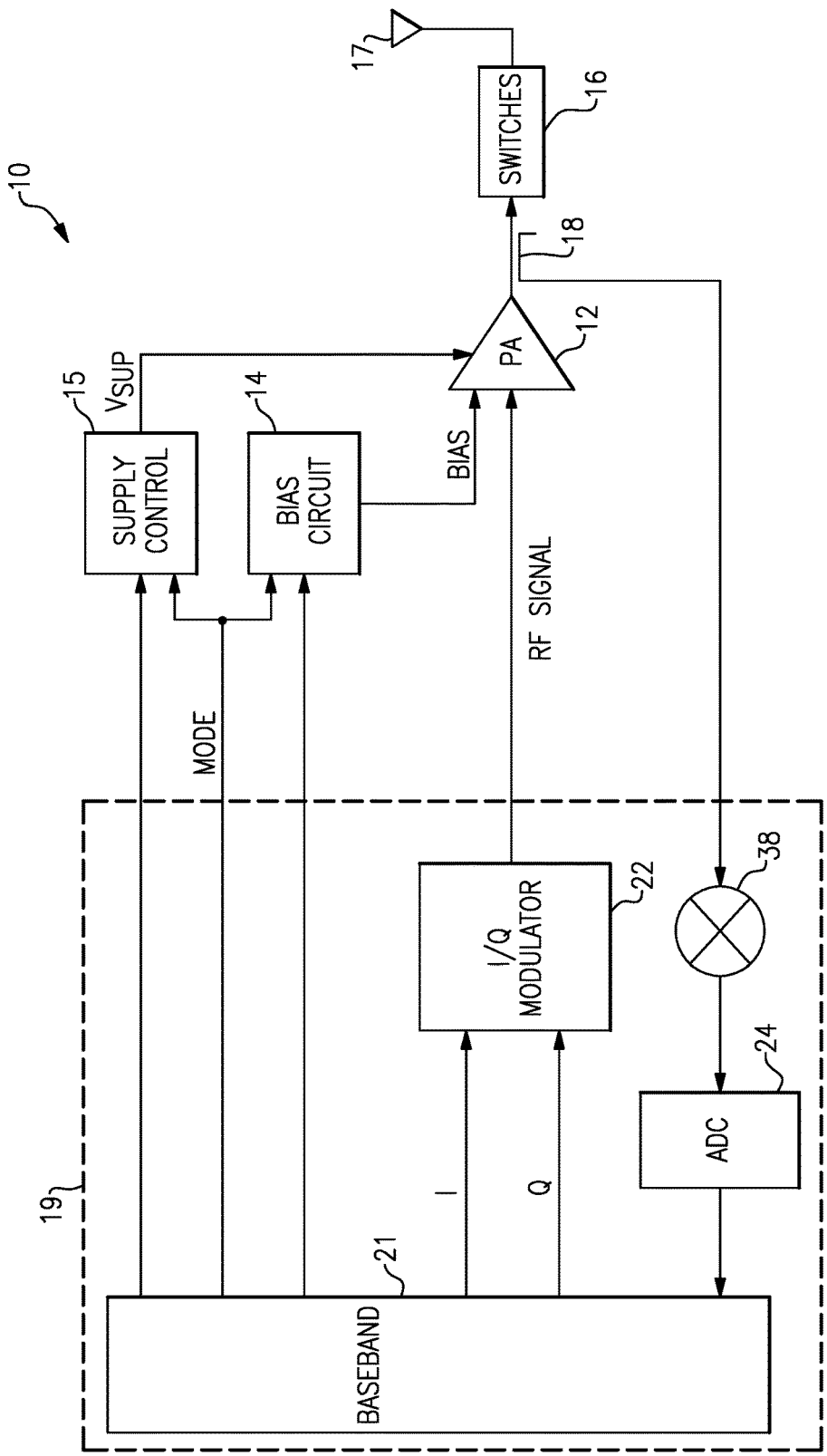
FIG. 1 is a schematic diagram of an example power amplifier system.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

It can be important to manage the amplification of an RF signal, as amplifying the RF signal to an incorrect power level or introducing significant distortion to the original RF signal can cause a wireless communication device to transmit out of band or violate compliance with an accepted standard. Biasing a power amplifier device can be a significant part of managing the amplification because it can determine the voltage and/or current operating point of the amplifying devices within the power amplifier.

Certain power amplifier circuits include stacked power amplifier topologies. For instance, device stacking for silicon-on-insulator power amplifier circuit topologies can overcome relatively low breakdown voltages of scaled transistors. Such device stacking can be beneficial in applications in which a stacked amplifier is exposed to a relatively large voltage swing, such as a voltage swing exceeding about 2.75 Volts. Stacking several transistors, such as 3 or 4 transistors, can result in a power amplifier with desirable operating characteristics. For instance, a power amplifier with such stacked transistors can behave desirably for supply voltages in a range between about 3 Volts to about 3.6 Volts and voltage swings approaching about 8 Volts without experiencing significant hot carrier injection (HCI) and corresponding long-term effects of reduced transistor drain current and increased transistor leakage.

Multi-mode power amplifiers can include a supply control circuit that provides the power amplifier with a power supply voltage that can vary depending on a mode of operation of the power amplifier. As an example, in a multiple power-mode, variable supply power amplifier, a lower supply voltage can be provided in a lower power mode and a higher supply voltage can be provided in a higher power mode. In some instances, a power amplifier can include multiple stages and the supply voltage provided to the stacked output stage can be varied depending on the power mode while a different supply voltage for an earlier stage remains substantially constant. When a supply voltage for a power amplifier is reduced in a lower power mode for efficiency purposes, the supply voltage can be significantly lower than for a higher power mode. For example, the supply voltage for a lower power mode can be about 60% below the supply voltage for a higher mode. Such a reduction in supply voltage can result in reduced drain-to-source voltage ($V_{DS}$) headroom operation that drives stacked-device field effect transistor (FET) topologies into early power compression, which can in turn reduce the attainable output 1 dB compression point (OP1dB), saturated power ($P_{SAT}$), and/or power-added efficiency (PAE) of the power amplifier.

Aspects of this disclosure relate to a stacked amplifier and bias circuit. The stacked amplifier includes at least a first transistor and a second transistor in series with each other. The stacked amplifier is operable in at least a first mode and a second mode. The bias circuit is configured to bias the second transistor to a linear region of operation in the first mode. The bias circuit is configured to bias the second transistor as a switch in the second mode. Accordingly, the bias circuit can bias the stacked amplifier such that the stacked amplifier behaves like there is at least one less transistor in the stack in the second mode relative to the first mode. Such operation can result in meeting design specifications for different power modes, in which a supply voltage provided to the stacked amplifier is lower in the second mode than in the first mode.

For example, in a stacked silicon-on-insulator power amplifier, an output stage can include a stacked architecture with a common source transistor in series with one or more common gate transistors. This can prevent breakdown during high and/or medium power modes of operation (e.g., modes in which a supply voltage for the output stage are 3 Volts and 1.8 Volts, respectively). In the lowest power mode of operation (e.g., a mode with a supply voltage for the output stage of 1.2 Volts), both the specified power supply level and the voltage swing can be better accommodated by having at least one less transistor in the stack. In certain implementations, a common gate transistor in the stacked amplifier being operated as a switch (as opposed to a common gate stage) by turning it ON hard enough such that its $V_{DS}$ is sufficiently low (e.g., less than about 100 mV or less than about 75 mV) to thereby reduce and/or minimize its effect on the headroom and allowing improved OP1dB and $P_{SAT}$ (e.g., about 13 dBm).

Accordingly, certain embodiments discussed herein can overcome problems associated with operating a stacked-transistor silicon-on-insulator power amplifier topology in multiple modes of operation with a relatively large difference in supply voltage provided to the power amplifier in different modes of operation. For instance, a triple-stacked-transistor silicon-on-insulator power amplifier topology operable in three power modes in which a lowest power-mode has a supply voltage that is about 60% below the supply voltage for a highest power mode can operate with desirable performance in accordance with the principles and advantages discussed herein.

Embodiments of this disclosure relate to using a common power amplifier for multiple modes of operation. Using the same power amplifier for several power modes can be desirable, as this can prevent increased die area and complications with matching networks and RF-signal routing associated with using different power amplifiers for different power modes.

Embodiments of this disclosure can be implemented with semiconductor-on-insulator technology, such as silicon-on-insulator technology. Using silicon-on-insulator technology and stacked transistor topologies can enable power amplifiers to be implemented in relatively inexpensive and relatively reliable technology. Moreover, the desirable performance of low-noise amplifiers (LNAs) and/or multi-throw RF switches in silicon-on-insulator technology can enable a stacked transistor silicon-on-insulator power amplifier to be implemented as part of a complete front end integrated circuit (FEIC) solution that includes transmit, receive, and switching functionality with desirable performance.

FIG. 1 is a schematic diagram of a power amplifier system 10. The illustrated power amplifier system 10 includes a power amplifier 12, a bias circuit 14, a supply control circuit 15, switches 16, an antenna 17, a directional coupler 18, and a transmitter 19. The power amplifier system 10 can operate in multiple modes of operation. The multiples modes of operation can include at least two different modes of operation in which the supply control circuit 15 provides a supply voltage $V_{SUP}$ having different voltage levels to the power amplifier 12. The bias circuit 14 can bias the power amplifier differently in two or more of the at least two different modes of operation. The illustrated transmitter 19 includes a baseband processor 21, an I/Q modulator 22, a mixer 23, and an analog-to-digital converter (ADC) 24. The transmitter 19 can be included in a transceiver that also includes circuitry associated with receiving signals from an antenna (for instance, the antenna 17) over one or more receive paths.

The power amplifier 12 can amplify an RF signal. The RF signal can be provided by the I/Q modulator 22 of the transmitter 19. The amplified RF signal generated by the power amplifier 12 can be provided to the antenna 17 by way of the switches 16. The amplified RF signal can have a substantially constant envelope in certain applications. The amplified RF signal can have a variable envelope in some applications. Moreover, the power amplifier 12 can provide an amplified RF signal that has a substantially constant envelope in one mode and a variable envelope in another mode. The power amplifier 12 can be operated in multiple modes, such as multiple power modes. The power amplifier 12 can include a stacked transistor topology, such as any of the stacked topologies discussed herein. The power amplifier 12 can be implemented by silicon-on-insulator technology. The power amplifier 12 can include field effect and/or bipolar transistors.

The voltage level of the supply voltage $V_{SUP}$ provided to the power amplifier 12 can be different in different modes of operation. The supply control circuit 15 can be any suitable circuit to provide the supply voltage $V_{SUP}$ to the power amplifier 12. The supply control circuit 15 can include a direct current to direct current (DC-DC) converter, for example. The supply control circuit 15 can include any other suitable switching regulator, such a buck and/or boost converter in certain implementations.

In certain implementations, the power amplifier 12 is a multi-stage power amplifier. The supply control circuit 15 can provide different supply voltages for different stages of the multi-stage amplifier. The voltage level of the supply voltage $V_{SUP}$ provided to an output stage of the power amplifier 12 can be significantly lower (e.g., about 60% lower) in one mode of operation than in another mode of operation. Significant differences in the voltage level of the supply voltage can result in reduced headroom operation that can drive a stacked transistor circuit topology into early power compression. Early power compression can degrade performance of the power amplifier 12. For instance, early power compression can reduce OP1dB, $P_{SAT}$, PAE, the like, or any combination thereof of the power amplifier 12.

The bias signal BIAS received by the power amplifier 12 from the bias circuit 14 can bias the power amplifier 12 for operation in the various modes of the multiple modes. The bias circuit 14 can be implemented by any suitable bias circuit for the power amplifier 12. The bias circuit 14 can bias a transistor in a stacked transistor power amplifier stage of the power amplifier 12 to a linear region of operation in a first mode and bias the transistor in the stacked transistor power amplifier stage as a switch in a second mode in which the voltage level of the supply voltage $V_{SUP}$ is significantly lower than in the first mode. For instance, a common gate transistor (or a common base transistor in a bipolar implementation) of the stacked transistor power amplifier stage can be operated in the linear region in the first mode and turned ON hard to act as a switch in the second mode. This can reduce or eliminate the common gate transistor's effect on headroom when the transistor is biased as a switch. Accordingly, the OP1dB and $P_{SAT}$ can be improved in the second mode.

In the illustrated power amplifier system 10, the directional coupler 18 is positioned between the output of the power amplifier 12 and the input of the switches 18, thereby allowing a measurement of output power of the power amplifier 12 that does not include insertion loss of the switches 17. The sensed output signal from the directional coupler 18 can be provided to the mixer 23, which can multiply the sensed output signal by a reference signal of a controlled frequency so as to downshift the frequency content of the sensed output signal to generate a downshifted signal. The downshifted signal can be provided to the ADC 24, which can convert the downshifted signal to a digital format suitable for processing by the baseband processor 21.

By including a feedback path between the output of the power amplifier 12 and the baseband processor 21, the baseband processor 21 can be configured to dynamically adjust the I and Q signals to optimize the operation of the power amplifier system 10. For example, configuring the power amplifier system 10 in this manner can aid in controlling the power added efficiency (PAE) and/or linearity of the power amplifier 12.

The baseband signal processor 21 can generate an I signal and a Q signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 22 in a digital format. The baseband processor 21 can be any suitable processor configured to process a baseband signal. For instance, the baseband processor 21 can include a digital signal processor, a microprocessor, a programmable core, or any combination thereof. Moreover, in some implementations, two or more baseband processors 21 can be included in the power amplifier system 10.

The I/Q modulator 22 can receive the I and Q signals from the baseband processor 21 and to process the I and Q signals to generate an RF signal. For example, the I/Q modulator 22 can include digital-to-analog converters (DACs) configured to convert the I and Q signals into an analog format, mixers for upconverting the I and Q signals to radio frequency, and a signal combiner for combining the upconverted I and Q signals into an RF signal suitable for amplification by the power amplifier 12. In certain implementations, the I/Q modulator 22 can include one or more filters configured to filter frequency content of signals processed therein.

Transistor stacking can be implemented in silicon-on-insulator power amplifiers. For instance, such transistor stacking can be implemented in the power amplifier 12 of FIG. 1. The transistor stacking can overcome relatively low breakdown voltages of scaled transistors, especially when exposed to voltage swing exceeding a voltage swing that can be accommodated by each transistor in the stacked such as 2.75 Volts.

Figure 2:
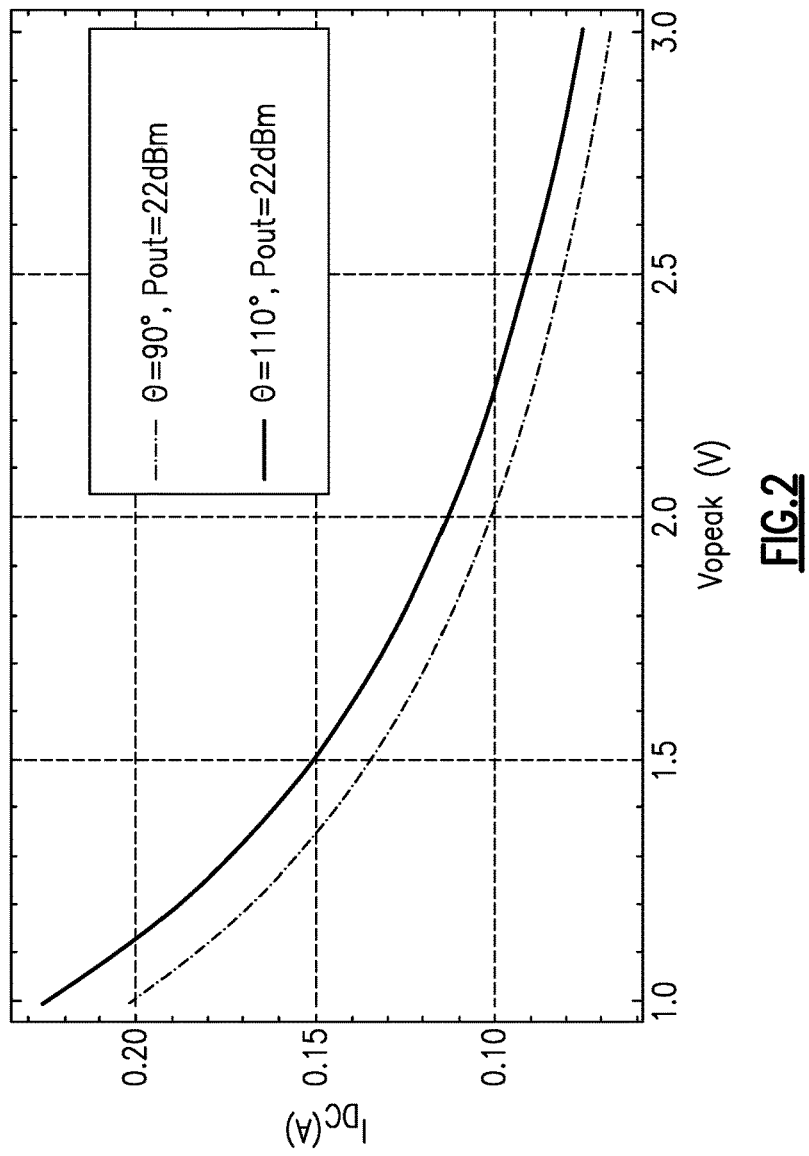
FIG. 2 is a graph illustrating a relationship between peak output voltage and direct current (DC) current for different conduction angles of a stacked amplifier at a fixed output power level.

FIG. 2 is a graph illustrating a relationship between peak output voltage and direct current (DC) current for conduction angles of a stacked amplifier at a fixed output power level.

Figure 3A:
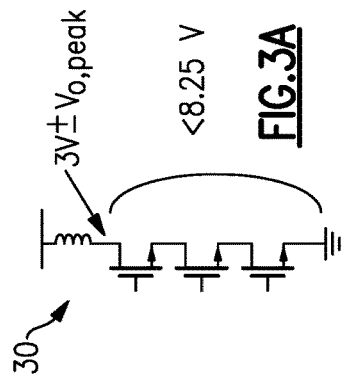
FIG. 3A illustrates a stacked amplifier with three transistors in the stack and a maximum allowable voltage swing of the stacked amplifier for a supply voltage.

FIG. 3A illustrates a stacked amplifier 30 with three transistors in the stack and a voltage swing of the stacked amplifier for a supply voltage. Stacking three transistors as shown in FIG. 3A can enable PA operation to work well with supply voltages between about 3 Volts to 3.6 Volts and voltage swings approaching greater than 8 Volts. For example, when each transistor in the stack can accommodate a voltage swing of up to about 2.75 Volts, the three stacked transistors can together accommodate a voltage swing of up to about 8.25 Volts without experiencing significant hot carrier injection (HCI) and corresponding long-term effects of reduced transistor drain current and increased transistor leakage.

Figure 3B:
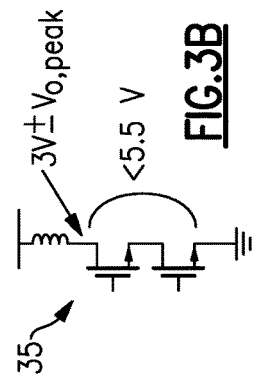
FIG. 3B illustrates a stacked amplifier with two transistors in the stack and a maximum allowable voltage swing of the stacked amplifier for the same supply voltage as FIG. 3A.

FIG. 3B illustrates a stacked amplifier 35 with two transistors in the stack and a voltage swing of the stacked amplifier for the same supply voltage as FIG. 3A. Compared to the stacked amplifier 30, the stacked amplifier 35 can accommodate about two thirds of the voltage swing. As an example, when each transistor in the stacked amplifier 35 can accommodate a voltage swing of up to about 2.75 Volts, the two stacked transistors can together accommodate a voltage swing of up to about 5.5 Volts without introducing significant HCI effects. Accordingly, the stacked amplifier 35 may not be suitable for applications with voltage swings of greater than 5.5 Volts in this example. As such, for applications with voltage swings of greater than 5.5 Volts, three or more transistors can be included in series with each other in a stacked amplifier.

For amplifiers operable with variable supply voltage levels in multiple power modes, headroom can be reduced in lower power modes with lower supply voltages. This can drive the stacked amplifier into early compression, which can reduce OP1dB and PAE. By having at least one less transistor in the stack, problems associated with reduced headroom can be reduced or eliminated. Accordingly, the stacked amplifier 35 can be more suitable than the stacked amplifier 30 when the supply voltage has a lower voltage level. Embodiments discussed herein relate to biasing stacked amplifiers such that they behave like the stacked amplifier 30 in a first mode with a supply voltage having a relatively high voltage level and such that they behave like the stacked amplifier 35 in a second mode with the supply voltage having a relatively low voltage level. As such, this biasing can enable the stacked amplifier to accommodate a relatively high voltage swing when the supply voltage has a relatively high voltage level and also to reduce or eliminate problems associated with headroom when the supply voltage has a relatively low voltage level.

Figure 4A:
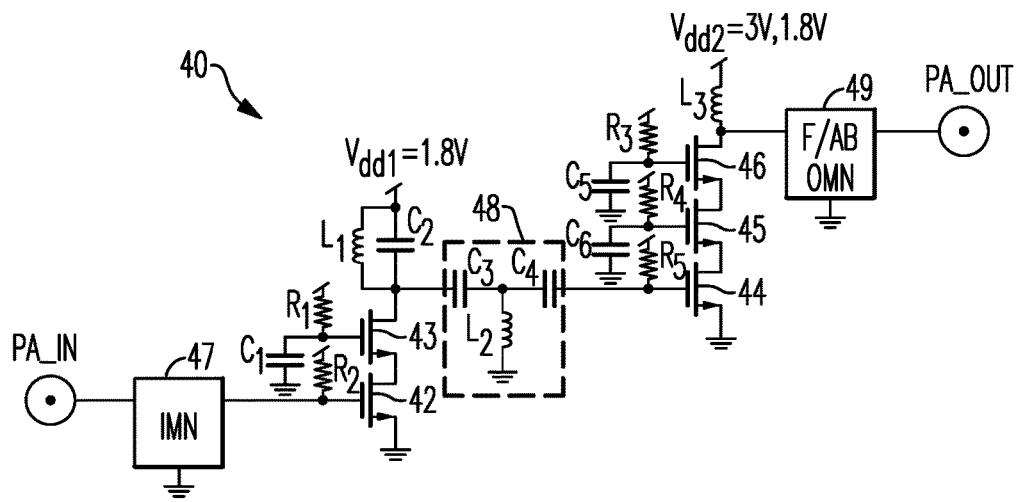
FIG. 4A is a schematic diagram of a triple-stacked power amplifier architecture with conceptual biasing illustrated for two modes of operation according to an embodiment.

FIG. 4A is a schematic diagram of power amplifier system 40 with conceptual biasing illustrated for two modes of operation of a stacked output stage according to an embodiment. The illustrated power amplifier system 40 includes an input stage, an output stage, matching networks, and biasing circuit elements. The power amplifier system can receive an RF input signal PA_IN and provide an amplified RF output signal PA_OUT. The power amplifier 12 of FIG. 1 can be implemented in accordance with any of the principles and advantages of the power amplifier system 40.

As illustrated, the input stage includes a stacked amplifier implemented by transistors 42 and 43. Such an amplifier can be referred to as a cascode amplifier. The stacked amplifier of the input stage can be biased by conceptual biasing circuit elements $R_1$ and $R_2$. The conceptual bias circuit elements $R_1$ and $R_2$ can be implemented by any suitable biasing circuit elements and can include circuitry in additional to and/or in place of the illustrated resistors. An AC grounding gate capacitor $C_1$ can be electrically connected to the common gate transistor 43. In some other implementations, the input stage can alternatively include an injection-lockable power oscillator that can be frequency and phase locked to an input modulated signal. The input stage can receive an input stage supply voltage $V_{dd1}$. A parallel LC circuit including an inductor L1 and a capacitor C2 can provide the input stage supply voltage $V_{dd1}$ to the stacked amplifier of the input stage. The input stage supply voltage $V_{dd1}$ can be substantially the same in different modes of operation.

The output stage of the illustrated power amplifier system 40 is a triple-stacked amplifier. The illustrated output stage includes two common gate transistors 45 and 46 in series with a common source transistor 44. The transistors 44, 45, and 46 can be silicon-on-insulator transistors. The transistor 45 can be biased to a linear region of operation by conceptual biasing circuit element $R_4$. Similarly, the transistor 46 can be biased to a linear region of operation by conceptual biasing circuit element $R_3$. The conceptual bias circuit elements $R_3$ and $R_4$ can be implemented by any suitable biasing circuit elements and can include circuitry in additional to and/or in place of the illustrated resistors. AC grounding gate capacitors $C_5$ and $C_6$ can be electrically connected to gates of the common gate transistors 46 and 45, respectively. The transistor 44 can be biased by a biasing circuit element $R_5$. Such a triple-stacked output stage can prevent breakdown in modes of operation in which an output stage supply voltage $V_{dd2}$ is 3 Volts and 1.8 Volts, respectively, for example. In the circuit illustrated in FIG. 4A, the output stage supply voltage $V_{dd2}$ being 3 Volts corresponds to a first mode and the output stage supply voltage $V_{dd2}$ being 1.8 Volts corresponds to a third mode.

The power amplifier system 40 can include matching networks for impedance matching. The illustrated matching networks include an input matching network 47, an inter-stage matching network 48, and an output matching network 49. In FIG. 4A, an input matching network 47 is electrically coupled between an input of the power amplifier system and the input stage. The inter-stage matching network 48 can include any suitable circuit elements for inter-stage impedance matching. An inter-stage matching network between stages of power amplifiers discussed herein can include a T-network and/or a pi-network in certain applications. The illustrated inter-stage matching network 48 includes capacitors $C_3$ and $C_4$ and inductor $L_2$ arranged as a T-network. The output matching network 49 can be a class F output matching network, a class AB output matching network, a class B output matching network, or any other suitable output matching network. The output stage of the power amplifier system 40 can drive any suitable load. The power amplifier 12 of FIG. 1 can be implemented in accordance with any of the principles and advantages of the power amplifier system 40.

Figure 4B:
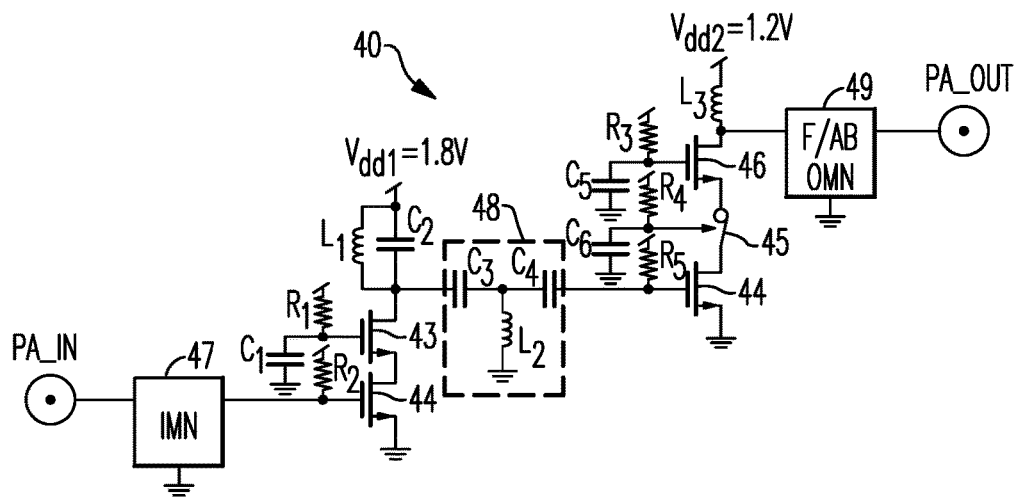
FIG. 4B is a schematic diagram of the triple-stacked power amplifier architecture of FIG. 4A with conceptual biasing illustrated for a different mode of operation.

FIG. 4B is a schematic diagram of the power amplifier system 40 of FIG. 4A with biasing illustrated for a second mode of operation according to an embodiment. The second mode of operation can be a lower power mode than the modes associated with the biasing in FIG. 4A. As illustrated in FIG. 4B, the output stage supply voltage $V_{dd2}$ is 1.2 Volts. The common gate transistor 45 is biased so as to operate as a switch instead of a common gate stage in FIG. 4B. The common gate transistor 45 can be turned ON hard enough such that its $V_{DS}$ is sufficiently low (e.g., less than about 100 mV or less than about 75 mV) to make its effect on headroom insignificant. This can allow the $P_{SAT}$ to about around 13 dBm in the second mode of operation in certain implementations.

Accordingly, the power amplifier system 40 can operate in at least three different power modes with different output stage supply voltages. In the example of FIGS. 4A and 4B, the output stage supply voltage $V_{dd2}$ can be 3 Volts in a high power mode, the output stage supply voltage $V_{dd2}$ can be 1.8 Volts in a medium power mode, and the output stage supply voltage $V_{dd2}$ can be 1.2 Volts in a low power mode. The high power mode can be a first mode, the lower power mode can be a second mode, and the medium power mode can be a third mode. The common gate transistor 45 can be biased to a linear region of operation in the high power mode and the medium power mode, as illustrated in FIG. 4A. In the low power mode, the common gate transistor 45 can be biased to as a switch, as illustrated in FIG. 4B. As such, the same power amplifier can be used in multiple power modes of operation while meeting performance specifications for each of the multiple power modes.

Figure 4C:
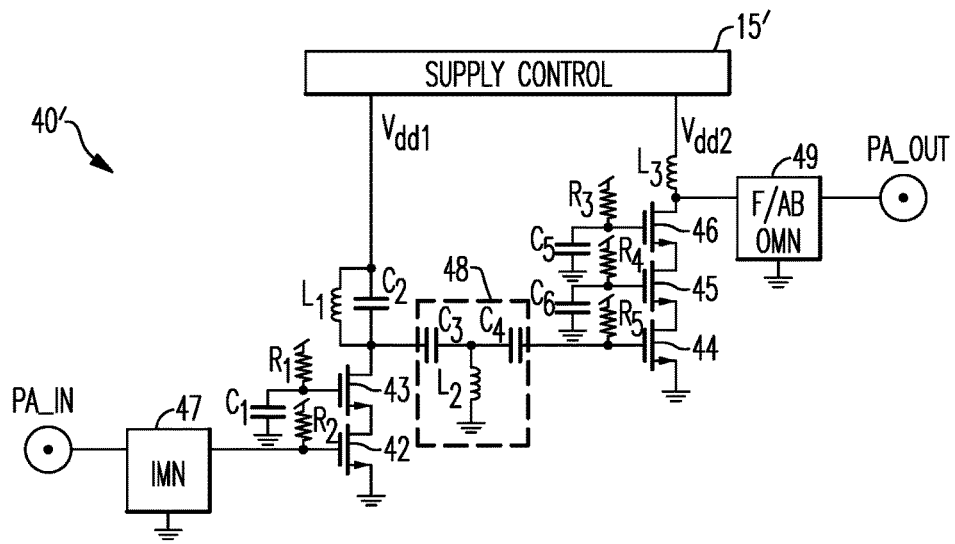
FIG. 4C is a schematic diagram of a power amplifier system with conceptual biasing illustrated for a first mode of operation according to an embodiment.
Figure 4D:
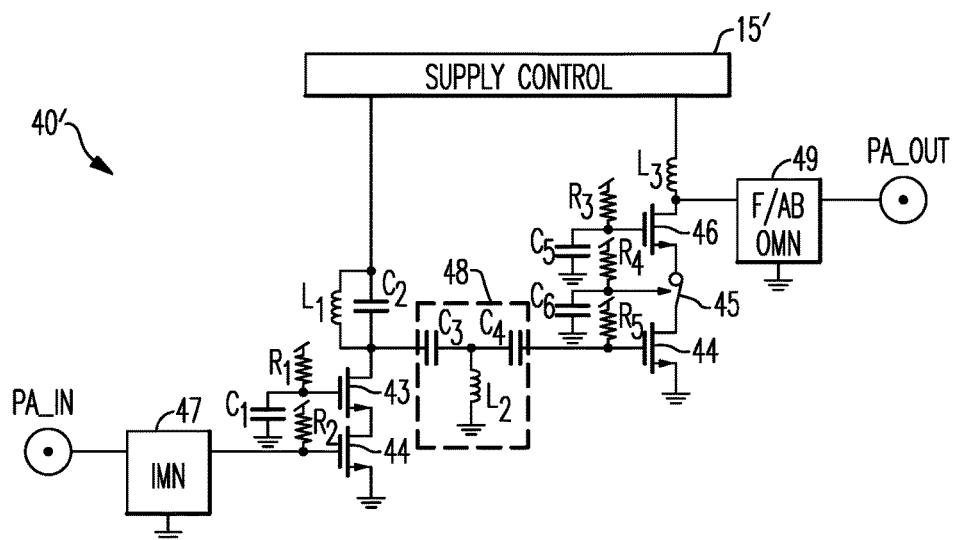
FIG. 4D is a schematic diagram of the power amplifier system of FIG. 4C with conceptual biasing illustrated for a second mode of operation.

FIG. 4C is a schematic diagram of a power amplifier system 40' with conceptual biasing illustrated for a first mode of operation according to an embodiment. FIG. 4D is a schematic diagram of the power amplifier system 40' of FIG. 4C with conceptual biasing illustrated for a second mode of operation. The power amplifier system 40' is like the power amplifier system 40 of FIGS. 4A and 4B except that a supply control circuit 15' is included. The supply control circuit 15' can implement any suitable features of the supply control circuit of FIG. 1. The supply control circuit 15' can provide the input stage supply voltage $V_{dd1}$ and the output stage supply voltage $V_{dd2}$ to the power amplifier. The input stage supply voltage $V_{dd1}$ can have substantially the same voltage level in different modes of operation. The supply control circuit 15' can provide the output stage supply voltage $V_{dd2}$ such that the output stage supply voltage $V_{dd2}$ has a higher voltage level in the first mode corresponding to FIG. 4C than in the second mode corresponding to FIG. 4D. The supply control circuit 15' can include any suitable circuit configured to perform this functionality. For instance, the supply control circuit 15' can include a DC-DC converter or any other suitable switching regulator, such a buck and/or boost converter in certain implementations.

FIGS. 4A to 4D show an embodiment of an output stage of a power amplifier. FIGS. 5A to 8B illustrate embodiments of stacked amplifiers and bias circuits. Any of the principles and advantages discussed with reference to any of these figures can be implemented in the power amplifier 12 of FIG. 1 and/or the output stage of the power amplifier system 40. Moreover, any of the principles and advantages of the stacked amplifiers and bias circuits discussed herein can be implemented in other contexts.

Figure 5A:
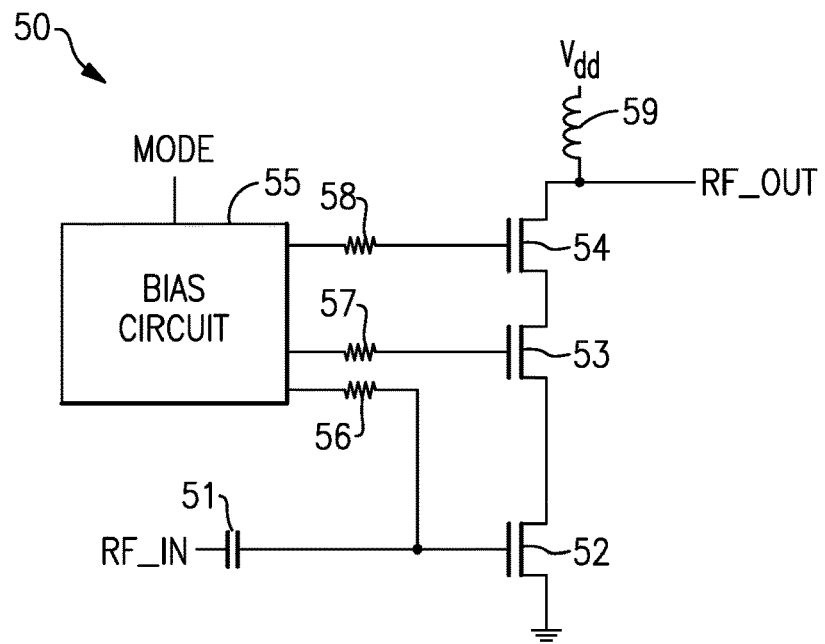
FIG. 5A is a schematic diagram of a stacked amplifier and a bias circuit in a first mode according to an embodiment.

FIG. 5A is a schematic diagram of an amplification circuit 50 that includes a stacked amplifier and a bias circuit in a first mode according to an embodiment. The stacked amplifier can amplify an RF signal. A DC blocking capacitor 51 can provide an RF signal to an input of the stacked amplifier. As illustrated, the stacked amplifier includes transistors 52, 53, and 54 arranged in series with each other. The transistors 52, 53, and 54 can be silicon-on-insulator field effect transistors. The bias circuit 55 can bias the transistors of the stacked amplifier. The bias circuit 55 can dynamically bias the transistors of the stacked amplifier responsive to a control signal MODE. The stacked amplifier can receive bias signals by way of biasing circuit elements 56, 57, and 58. In the first mode, the bias circuit 55 biases the transistor 53 to a linear region of operation. The stacked amplifier can receive a supply voltage $V_{dd}$ by way of an inductor 59.

Figure 5B:
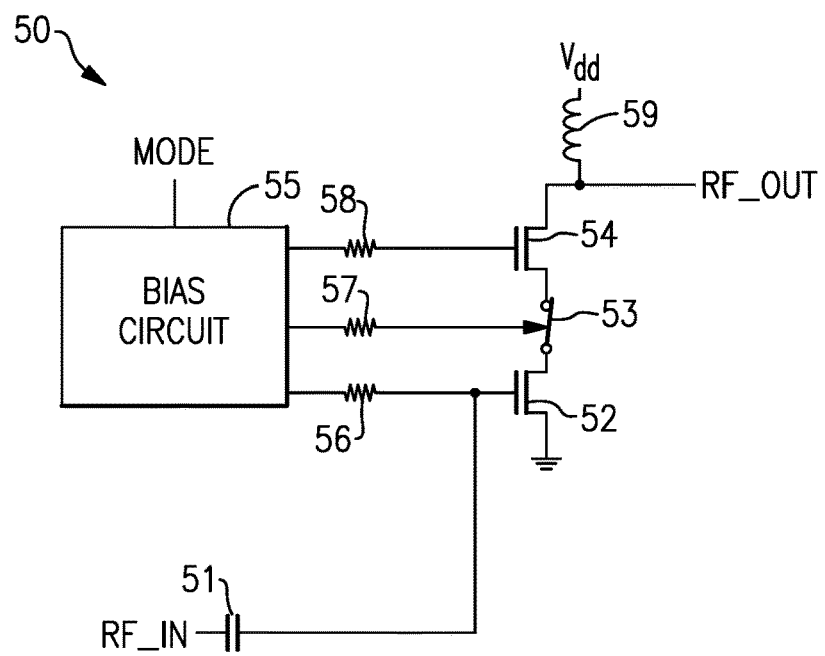
FIG. 5B is a schematic diagram of the stacked amplifier and the bias circuit of FIG. 5A in a second mode according to an embodiment.

FIG. 5B is a schematic diagram of the amplification circuit 50 of FIG. 5A in a second mode according to an embodiment. The second mode can be associated with a lower power than the first mode. In the second mode of operation, the supply voltage $V_{dd}$ provided to the stacked amplifier can have a higher voltage level than in the first mode. The mode control signal MODE provided to the bias circuit 55 can be at a different signal level and/or in a different state. Responsive to the mode control signal MODE, the bias circuit 55 can bias the transistor 53 as a switch. The transistor 53 can operate in a saturation region of operation in the second mode.

Figure 6A:
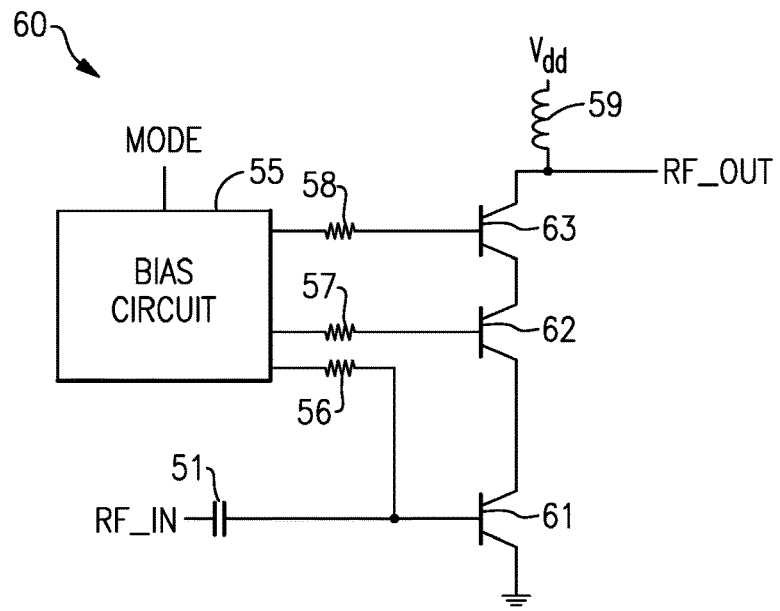
FIG. 6A is a schematic diagram of a stacked amplifier with bipolar transistors and a bias circuit in a first mode according to an embodiment.

FIG. 6A is a schematic diagram of an amplification circuit 60 that includes a stacked amplifier and a bias circuit in a first mode according to an embodiment. The amplification circuit 60 is like the amplification circuit 50 except the stacked amplifier is implemented by bipolar transistors. As illustrated in FIG. 6A, the stacked amplifier includes two common base transistors 62 and 63 in series with a common emitter transistor 61. The bipolar transistors illustrated in FIG. 6A can be implemented by semiconductor-on-insulator technology. Any suitable circuit topologies discussed and/or illustrated herein with field effect transistors can alternatively be implemented by bipolar transistors. According to some other embodiments, the amplification circuit 60 can include an RF impedance, such as an inductor, disposed between the bias circuit 55 and the base of the transistor 61 in place of the resistor illustrated in FIGS. 6A and 6B. Alternatively or additionally, an amplification circuit with a stacked bipolar amplifier can be implemented without resistors disposed between a bias circuit and one or more of the bipolar transistors of the stack.

Figure 6B:
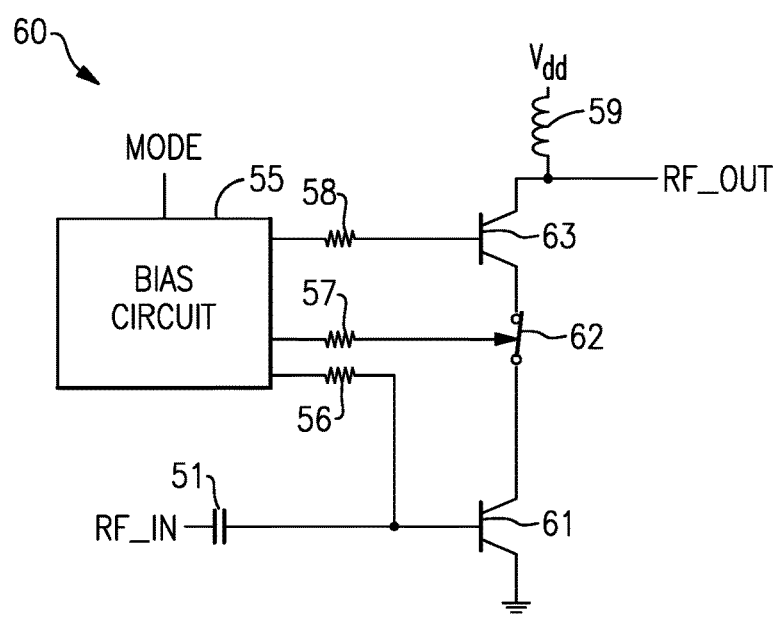
FIG. 6B is a schematic diagram of the stacked amplifier and the bias circuit of FIG. 6A in a second mode of operation according to an embodiment.

FIG. 6B is a schematic diagram of the amplification circuit 60 of FIG. 6A in a second mode of operation according to an embodiment. In the second mode of operation, the transistor 62 is biased as a switch.

Figure 7A:
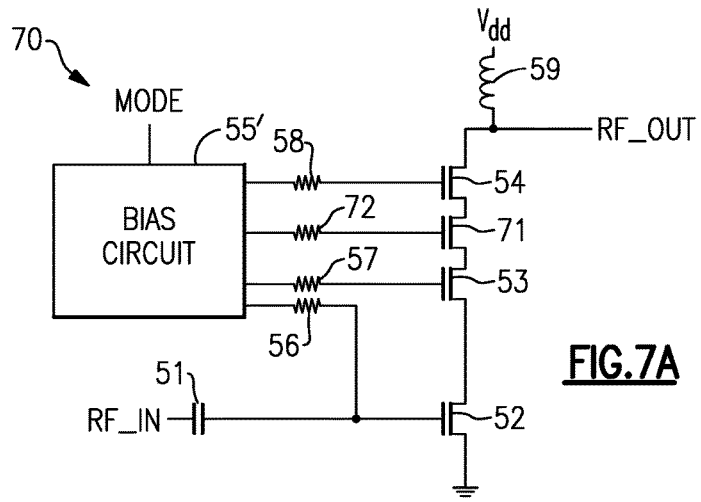
FIG. 7A is a schematic diagram of a stacked amplifier with four transistors in the stack and a bias circuit in a first mode according to an embodiment.

FIG. 7A is a schematic diagram of an amplification circuit 70 that includes stacked amplifier with four transistors in the stack and a bias circuit in a first mode according to an embodiment. The amplification circuit 70 is like the amplification circuit 50 except the stacked amplifier is implemented by four transistors that are in series with each other. The stacked amplifier illustrated in FIG. 7A includes transistors 52, 53, 71, and 54. By having an additional transistor in the stack relative to the stacked amplifier shown in FIG. 5A, the stacked amplifier in FIG. 7A can accommodate a larger voltage swing. The bias circuit 55' can bias the transistor 71 by way of a biasing circuit element 72. In the first mode, the transistors 53 and 71 can be biased in a linear region of operation.

Figure 7B:
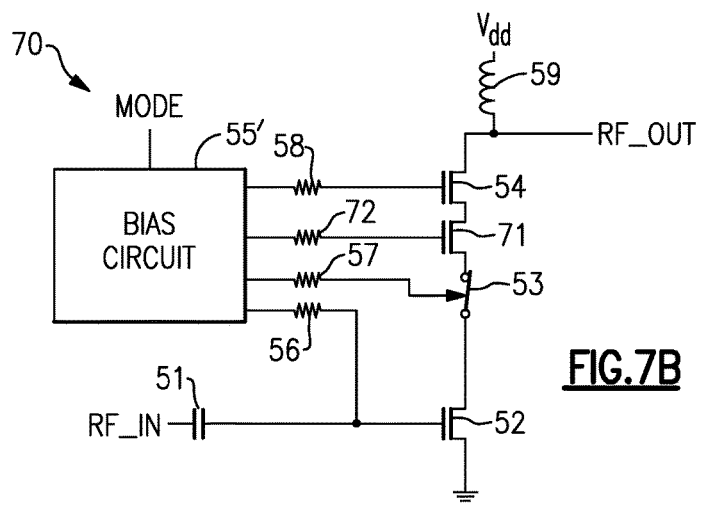
FIG. 7B is a schematic diagram of the stacked amplifier and the bias circuit of FIG. 7A in a different mode.
Figure 7C:
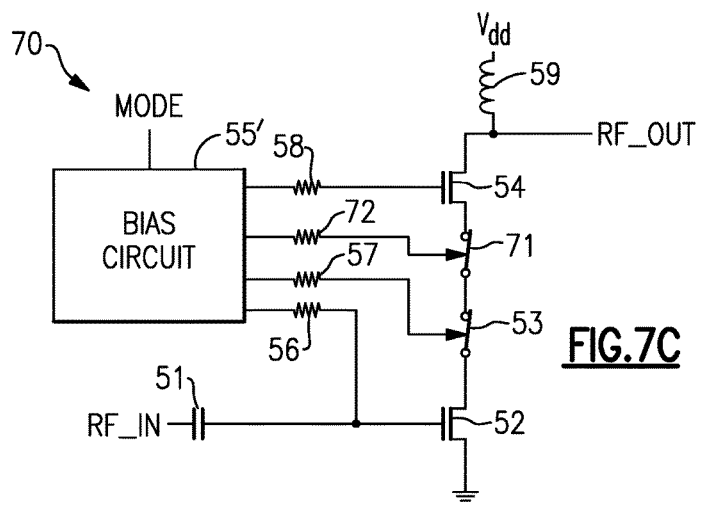
FIG. 7C is a schematic diagram of the stacked amplifier and the bias circuit of FIG. 7A in a different mode than FIGS. 7A and 7B.

FIGS. 7B and 7C are schematic diagrams of the stacked amplifier and the bias circuit of FIG. 7A in different modes according to an embodiment. As shown in FIG. 7B, the transistor 53 can be biased as a switch in a second mode. The stacked amplifier of FIG. 7B can behave like a triple stack when the transistor 53 is biased as a switch and the other transistors of the stack are biased as gain stages. As shown in FIG. 7C the transistors 53 and 71 can be biased as switches in another mode. The stacked amplifier of FIG. 7C can behave like a double stack when the transistors 53 and 71 are biased as switches and the other transistors of the stack are biased as gain stages. Accordingly, the bias circuit 55' can bias the stacked amplifier of FIGS. 7A to 7C to behave as if 2, 3, or 4 transistors are in the stack. The principles and advantages discussed herein can also be applied to stacked amplifiers having five or more transistors in series with each other.

Figure 8A:
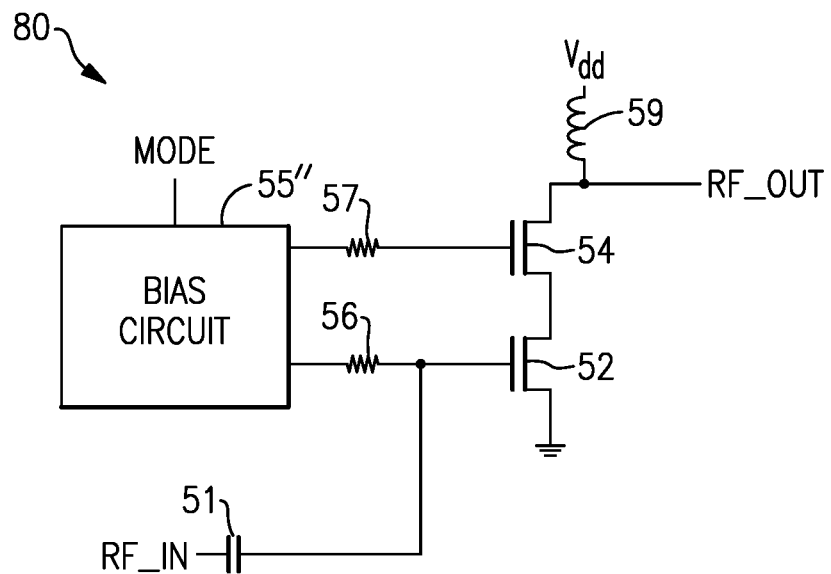
FIG. 8A is a schematic diagram of a stacked amplifier with two transistors in the stack and a bias circuit in a first mode according to an embodiment.

FIG. 8A is a schematic diagram of an amplification circuit 80 that includes a stacked amplifier with two transistors in the stack and a bias circuit in a first mode according to an embodiment. The amplification circuit 80 is like the amplification circuit 50 except that the stacked amplifier is implemented by two transistors that are in series with each other. As shown in FIG. 8A, the bias circuit 55" can bias the transistor 53 to a linear region of operation in the first mode.

Figure 8B:
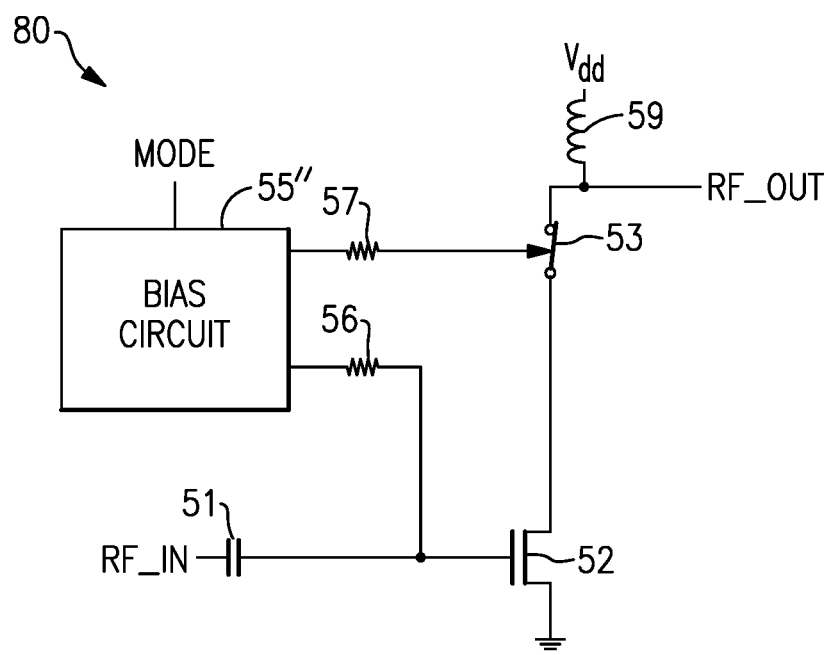
FIG. 8B is a schematic diagram of the stacked amplifier and the bias circuit of FIG. 8A in a second mode according to an embodiment.

FIG. 8B is a schematic diagram of the amplification circuit 80 of FIG. 8A in a second mode according to an embodiment. As shown in FIG. 8A, the bias circuit 55" can bias the transistor 53 in as a switch in the second mode.

Figure 9A:
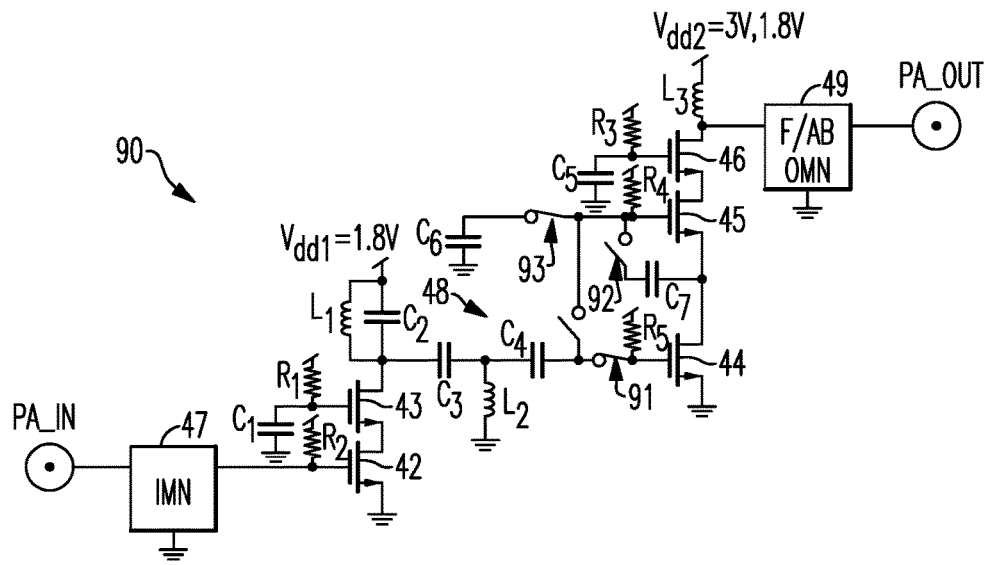
FIG. 9A is a schematic diagram of a triple-stacked power amplifier architecture having a switch to selectively provide an input signal to different transistors in the triple-stack according to an embodiment.
Figure 9B:
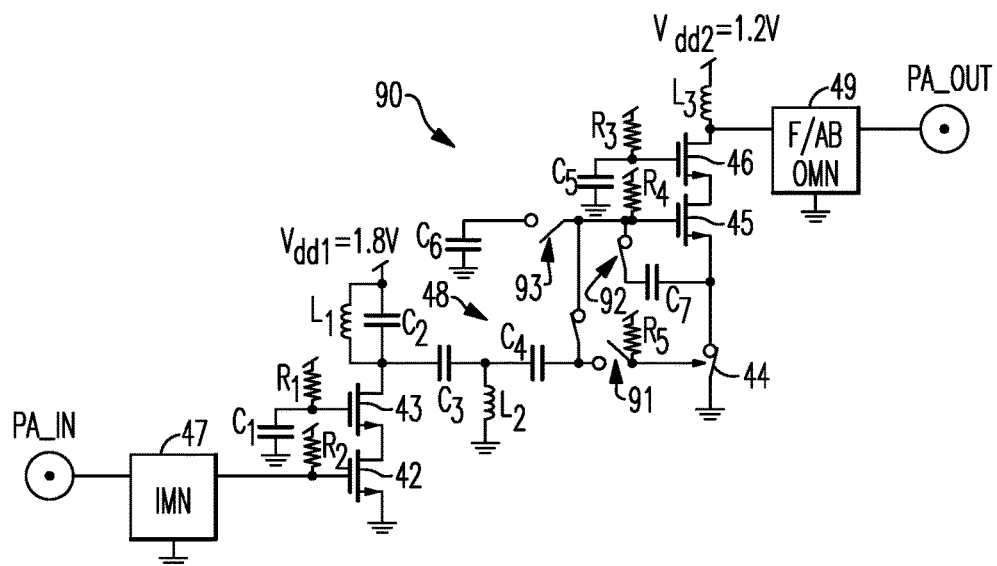
FIG. 9B is a schematic diagram of the triple-stacked power amplifier architecture of FIG. 9A with the conceptual biasing illustrated for a different mode of operation according to an embodiment.

FIG. 9A is a schematic diagram of a power amplifier system 90 with biasing illustrated for two modes of operation according to an embodiment. FIG. 9B is a schematic diagram of the power amplifier system 90 of FIG. 9A with biasing illustrated for a different mode of operation according to an embodiment. The power amplifier system 90 is like the power amplifier system 40 except that additional switches 91, 92, and 93 are included and a different transistor in the stack can be biased as a switch in a mode associated with a lower output stage supply voltage. Any suitable control circuit can control the switches 91, 92, and 93. In the power amplifier system 90, the transistor 44 can be biased to operate as a common source amplifier as shown in FIG. 9A or as a switch as shown in FIG. 9B.

The switch 91 can selectively electrically couple an output of the input stage to different transistors of the output stage in different modes of operation. The switch 91 can provide an RF input signal for the output stage to the transistor 44 in as shown in FIG. 9A. The switch 91 can provide the RF input signal to the output stage to the transistor 45 in a different mode as shown in FIG. 9B. The switch 91 can be a multi-throw switch, such as a single pole double throw switch.

The switch 92 can maintain an RF inter-stage match. The switch 92 can electrically couple a capacitor $C_7$ to the gate of the transistor 45 to maintain the RF inter-stage match when the transistor 44 is biased as a switch as shown in FIG. 9B. When the transistor 45 is biased as a common gate amplifier as shown in FIG. 9A, the switch 92 can electrically disconnect the capacitor $C_7$ from the gate of the transistor 45.

The switch 93 can electrically connects AC grounding gate capacitor $C_6$ to the gate of transistor 45 when the transistor 45 is configured as a common gate amplifier as shown in FIG. 9A. The switch 93 can disconnect AC grounding gate capacitor $C_6$ from the gate of transistor 45 when the transistor 45 is configured as a common source amplifier as shown in FIG. 9B.

Any suitable combination of features of the power amplifier systems 40 and 90 can be implemented together with each other. The power amplifier 12 of FIG. 1 can be implemented in accordance with any of the principles and advantages of the power amplifier system 90. The power amplifier system 90 can be implemented in accordance with any of the principles and advantages discussed herein, such as with reference to any of FIGS. 5A to 8B.

Figure 10A:
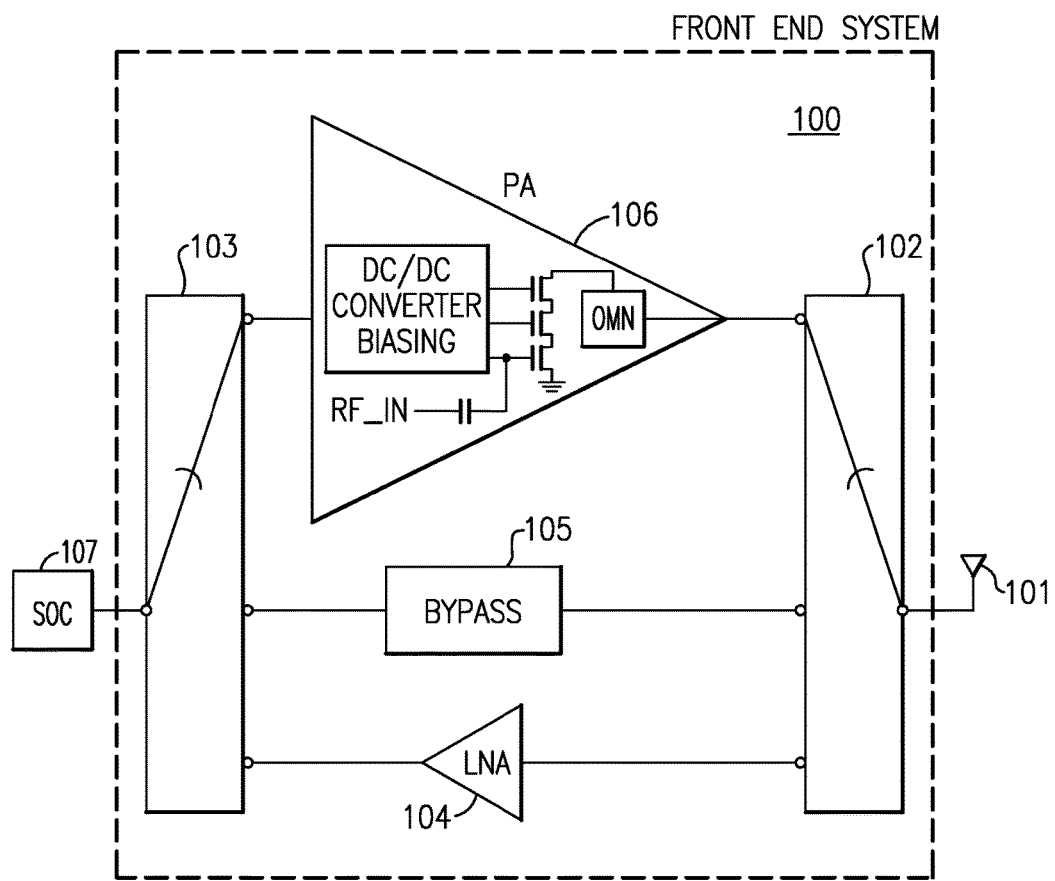
FIG. 10A is a schematic block diagram of a front end system according to an embodiment.
Figure 10B:
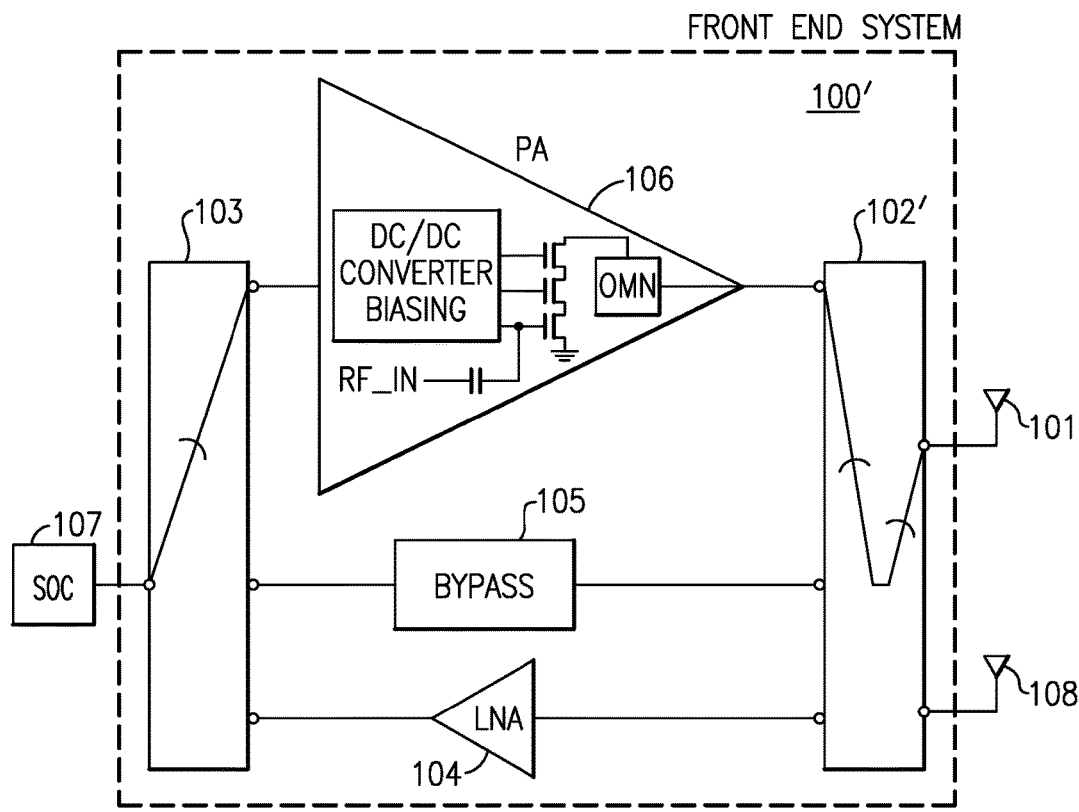
FIG. 10B is a schematic block diagram of a front end system according to another embodiment.

FIGS. 10A and 10B are schematic block diagrams of front end systems according to certain embodiments. An RF front end system can include circuits in a signal path between an antennas and a baseband system. Some RF front ends can include circuits in signal paths between one or more antennas and a mixer configured to module a signal to RF or to demodulate an RF signal.

The front end systems of FIGS. 10A and 10B can be in implemented in a packaged module. Such packaged modules can include relatively low cost laminate based front end modules that combine power amplifiers with low noise amplifiers and/or switch functions. Some such packaged modules can be multi-chip modules. In certain implementations, some or the all of the illustrated components in any of the front end systems in 10A and/or 10B can be embodied on a single integrated circuit. In certain implementations, some or the all of the illustrated components in any of the front end systems in 10A and/or 10B can be embodied on a single die. Such a die can be manufactured using any suitable process technology. As one example, the die can be a semiconductor-on-insulator die, such as a silicon-on-insulator die. According to some implementations, one or more antennas can be integrated with the RF any of the front end systems discussed herein.

FIG. 10A is a schematic block diagram of an RF front end system 100 according to an embodiment. The RF front end system 100 is configured to receive RF signals from an antenna 101 and to transmit RF signals by way of the antenna 101. The illustrated front end system 100 includes a first multi-throw switch 102, a second multi-throw switch 103, a receive signal path that includes an LNA 104, a bypass signal path that includes a bypass network 105, and a transmit signal path that includes a power amplifier circuit 106. The low noise amplifier 104 can be implemented by any suitable low noise amplifier. The bypass network 105 can include any suitable network for matching and/or bypassing the receive signal path and the transmit signal path. The bypass network 105 can be implemented by a passive impedance network or by a conductive trace or wire. The power amplifier circuit 106 includes a stacked amplifier and a bias circuit that can bias a transistor to a linear region in a first mode and as a switch in a second mode. The power amplifier circuit 106 can be implemented in accordance with any of the principles and advantages of any of the stacked amplifiers discussed herein. The power amplifier circuit 106 can include a DC-DC converter combined with the bias circuit.

The first multi-throw switch 102 can selectively electrically connect a particular signal path to the antenna 101. The first multi-throw switch 102 can electrically connect the receive signal path to the antenna 101 in a first state, electrically connect the bypass signal path to the antenna 101 in a second state, and electrically connect the transmit signal to the antenna 101 in a third state. The second multi-throw switch 103 can selectively electrically connect a particular signal path to an input/output port of the front end system 100, in which the particular signal path is the same signal path electrically connected to the antenna 101 by way of the first multi-throw switch 102. Accordingly, second multi-throw switch 103 together with the first multi-throw switch 102 can provide signal path between the antenna 101 and the input/output port of the front end system 100. A system on a chip (SOC) 107 can be electrically connected to the input/output port of the front end system 100.

FIG. 10B is a schematic block diagram of an RF front end system 100' according to an embodiment. The RF front end system 100' of FIG. 10B is similar to the RF front end system 100 of FIG. 10A, except the multi-throw switch 102' is configured to selectively electrically connect a particular signal path to either a first antenna 101 or a second antenna 108. The multi-throw switch 102' can be a multi-throw, multi-pole switch.

Figure 10C:
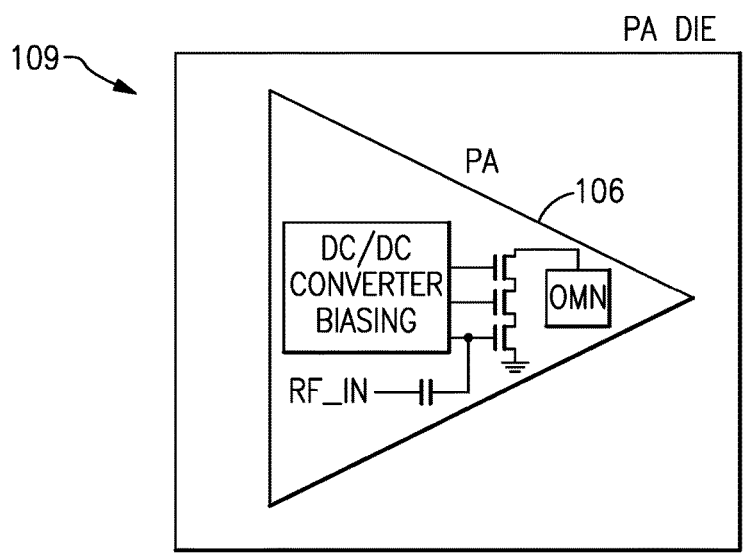
FIG. 10C is a schematic block diagram of a power amplifier die according to an embodiment.

FIG. 10C is a schematic block diagram of a power amplifier die 109 according to an embodiment. As illustrated, the power amplifier die 109 can include the power amplifier circuit 106. The power amplifier die 109 can include a stacked amplifier with any combination of features discussed herein. The power amplifier die 109 can be embodied in a multi-chip module.

Figure 11A:
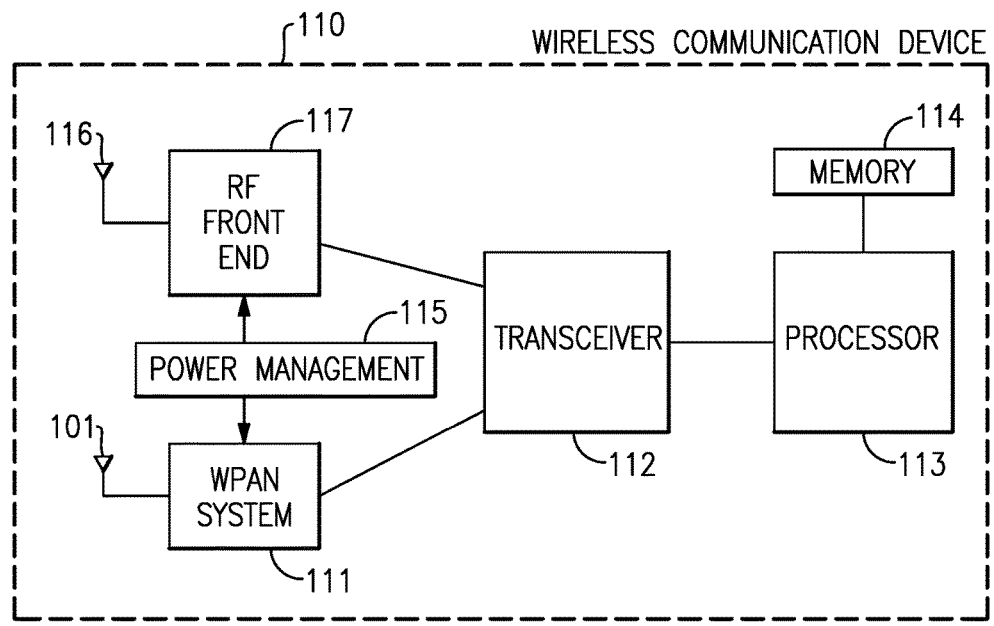
FIG. 11A is a schematic block diagram of an illustrative wireless communication device that includes a power amplifier and/or a front end system in accordance with one or more embodiments.
Figure 11B:
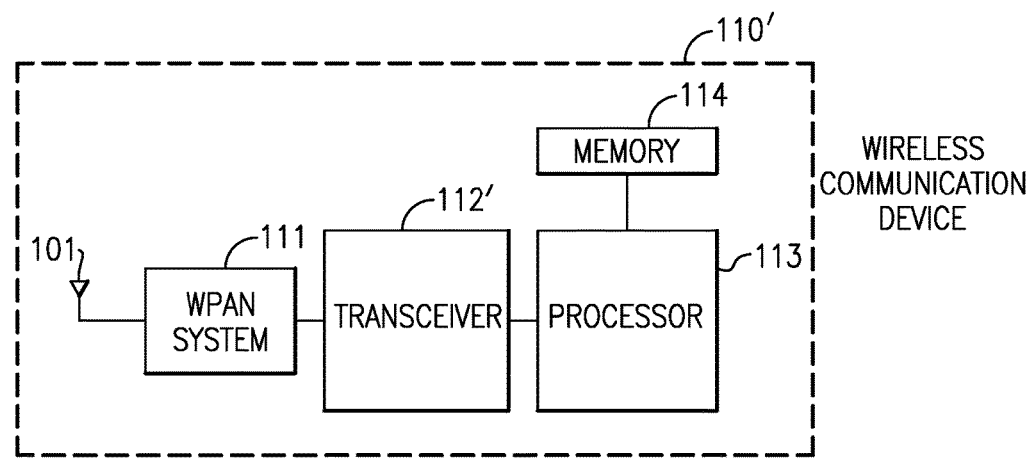
FIG. 11B is a schematic block diagram of another illustrative wireless communication device that includes a power amplifier and/or a front end system in accordance with one or more embodiments.

FIGS. 11A and 11B are schematic block diagrams of illustrative wireless communication devices that include a power amplifier and/or a front end system in accordance with one or more embodiments. The wireless communication device 110 can be any suitable wireless communication device. For instance, this device can be a mobile phone such as a smart phone. As illustrated, the wireless communication device 110 includes a first antenna 101, a WPAN system 111, a transceiver 112, a processor 113, a memory 114, a power management block 115, a second antenna 116, and an RF front end system 117. Any of the stacked amplifiers and biasing circuits discussed herein can be implemented in the wireless personal area network (WPAN) system 111 and/or the RF front end system 117. The WPAN system 111 is a RF front end system configured for processing RF signals associated with personal area networks (PANs). The WPAN system 111 can be configured to transmit and receive signals associated with one or more WPAN communication standards, such as signals associated with one or more of Bluetooth, ZigBee, Z-Wave, Wireless USB, INSTEON, IrDA, or Body Area Network. In another embodiment, a wireless communication device can include a wireless local area network (WLAN) system in place of the illustrated WPAN system, and the WLAN system can process Wi-Fi signals.

The illustrated wireless communication device 110' of FIG. 11B is a device configured to communicate over a PAN. This wireless communication device can be relatively less complex than the wireless communication device of FIG. 11A. As illustrated, the wireless communication device 110' includes an antenna 101, a WPAN system 111, a transceiver 112', a processor 113, and a memory 114. The WPAN system 111 can include a stacked amplifier and bias circuit in accordance with any of the principles and advantages discussed herein.

Some of the embodiments described above have provided examples in connection with power amplifiers, front end modules and/or wireless communications devices. However, the principles and advantages of the embodiments can be used for any other systems or apparatus that could benefit from any of the circuits described herein. Any of the principles and advantages of the embodiments discussed can be used in any other systems or apparatus that could benefit from the stacked amplifiers discussed herein. For example, any suitable principles and advantages discussed herein with reference to power amplifiers can be implemented in association with any RF amplifier.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An amplification circuit comprising:
   a stacked amplifier including at least a first transistor and a second transistor in series with each other, the stacked amplifier operable in at least a first mode, a second mode, and a third mode, the stacked amplifier being configured to receive a supply voltage, the supply voltage having a lower voltage level in the second mode than in the first mode, and the supply voltage having a different voltage level in the third mode than in both the first mode and the second mode; and
   a bias circuit configured to bias the second transistor to a linear region of operation in the first mode and to bias the second transistor as a switch in the second mode.

2. The amplification circuit of claim 1 wherein the stacked amplifier includes a third transistor in series with the first transistor and the second transistor.

3. The amplification circuit of claim 1 wherein the stacked amplifier is configured to amplify a radio frequency signal.

4. The amplification circuit of claim 1 wherein the bias circuit is configured to bias the second transistor in a saturation region of operation in the second mode.

5. The amplification circuit of claim 1 further comprising a first stage amplifier having an output electrically connected to an input of the stacked amplifier by way of a matching network.

6. The amplification circuit of claim 1 wherein the first transistor and the second transistor are semiconductor-on-insulator transistors.

7. The amplification circuit of claim 1 wherein the bias circuit is configured to bias the second transistor to the linear region of operation in the third mode.

8. The amplification circuit of claim 1 wherein the second mode is associated with a lower power than the first mode.

9. The amplification circuit of claim 1 further comprising an output matching network electrically connected to an output of the stacked amplifier, and the output matching network being either a class F output matching network or a class AB output matching network.

10. A power amplifier system comprising:
    a power amplifier stage including at least a first transistor and a second transistor in series with each other, the power amplifier stage operable in at least a first mode and a second mode;
    a bias circuit configured to bias the second transistor to a linear region of operation in the first mode and to bias the second transistor as a switch in the second mode; and
    a supply control circuit configured to provide a supply voltage to the power amplifier stage such that the supply voltage has a higher voltage level in the first mode than in the second mode, the supply control circuit being configured to receive a mode control signal and to adjust the voltage level of the supply voltage based on the mode control signal.

11. A power amplifier system comprising:
    a power amplifier stage including at least a first transistor and a second transistor in series with each other, the power amplifier stage operable in at least a first mode and a second mode;
    a bias circuit configured to bias the second transistor to a linear region of operation in the first mode and to bias the second transistor as a switch in the second mode; and a supply control circuit configured to provide a supply voltage to the power amplifier stage such that the supply voltage has a higher voltage level in the first mode than in the second mode, the supply control circuit being configured to provide the supply voltage such that the supply voltage has a different voltage level in a third mode than in both the first mode and the second mode.

12. The power amplifier system of claim 11 wherein the supply control circuit is configured to receive a mode control signal and to adjust the voltage level of the supply voltage based on the mode control signal.

13. The power amplifier system of claim 10 wherein the power amplifier stage includes a third transistor in series with the first transistor and the second transistor.

14. The power amplifier system of claim 10 wherein the bias circuit is configured to receive the mode control signal and to bias the second transistor based on the mode control signal.

15. A front end system comprising:
a low noise amplifier;
a power amplifier circuit including a stacked amplifier including at least a first transistor and a second transistor in series with each other, the stacked amplifier operable in at least a first mode and a second mode, the power amplifier circuit further including a bias circuit configured to bias the second transistor to a linear region of operation in the first mode and to bias the second transistor as a switch in the second mode; and
a switch electrically connected to the low noise amplifier and the power amplifier circuit, the switch being a multi-throw switch having at least a first throw electrically coupled to the power amplifier circuit and a second throw electrically coupled to the low noise amplifier.

16. The front end system of claim 15 further comprising a bypass path electrically coupled to a third throw of the multi-throw switch.

17. The front end system of claim 15 wherein the low noise amplifier and the power amplifier circuit are embodied on a single die.

18. The front end system of claim 15 further comprising a package enclosing the power amplifier circuit, the low noise amplifier, and the switch.

19. The power amplifier system of claim 11 further comprising a class F output matching network electrically connected to an output of the power amplifier stage.

20. The power amplifier system of claim 11 further comprising a class AB output matching network electrically connected to an output of the power amplifier stage.

* * * * *